(12) United States Patent
Ajiki

(10) Patent No.: US 7,612,412 B2
(45) Date of Patent: Nov. 3, 2009

(54) SEMICONDUCTOR DEVICE AND BOOST CIRCUIT

(75) Inventor: Yoshiharu Ajiki, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 584 days.

(21) Appl. No.: 11/387,227

(22) Filed: Mar. 22, 2006

(65) Prior Publication Data

US 2006/0238222 A1  Oct. 26, 2006

(30) Foreign Application Priority Data

Mar. 22, 2005  (JP) .............................. 2005-081152

(51) Int. Cl.
*H03K 17/73* (2006.01)

(52) U.S. Cl. .................. 257/368; 257/213; 257/288; 327/111; 327/109; 327/467; 327/157; 363/59

(58) Field of Classification Search ................. 257/213, 257/288, 368, E27.01, E27.011, E27.014, 257/E27.016; 327/111, 109, 467, 112, 157; 363/59, 60

See application file for complete search history.

(56) References Cited

U.S. PATENT DOCUMENTS

| 4,774,420 | A | * | 9/1988 | Sutton ........................ 327/111 |
| 6,717,216 | B1 | | 4/2004 | Doris et al. |
| 6,884,667 | B1 | | 4/2005 | Doris et al. |
| 7,116,156 | B2 | | 10/2006 | Myono et al. |
| 2002/0130703 | A1 | | 9/2002 | Tsai |

FOREIGN PATENT DOCUMENTS

| JP | 2001-211637 A | 8/2001 |
| JP | 2002-281739 | 9/2002 |
| JP | 2004-193596 | 7/2004 |
| JP | 2004-328901 | 11/2004 |
| JP | 2004-336985 | 11/2004 |

* cited by examiner

*Primary Examiner*—Michael B Shingleton
(74) *Attorney, Agent, or Firm*—Nutter McClennen & Fish LLP; John J. Penny, Jr.

(57) ABSTRACT

A semiconductor device, includes: a field-effect transistor that configures a charge-pump circuit; and a supporting substrate that supports the field-effect transistor so that the field-effect transistor provided on the supporting substrate becomes warpable in a channel direction.

3 Claims, 5 Drawing Sheets

SEMICONDUCTOR DEVICE AND BOOST CIRCUIT

Applicant hereby claims priority from JP 2005-081152 filed on Mar. 22, 2005, which is hereby incorporated by reference in its entirety.

BACKGROUND

1. Technical Field

The present invention relates to a semiconductor device and a booster circuit. In particular, the invention relates to a device that is applied to a method for improving the mobility of transistors used in a charge-pump circuit.

2. Related Art

Along with the progress of semiconductor manufacturing process in recent years, the denser integration and more function multiplication of semiconductor integrated circuits have been being accelerated, and the power supply voltage inside a semiconductor integrated circuit has been becoming lower. In addition, accompanied by the more function multiplication of semiconductor integrated circuits, the embedding of various power supplies, including high-voltage power supplies, has also been increasing. For example, non-volatile memories such as flash memories, EEPROMs, etc. and driver ICs of indicating elements such as liquid crystal, etc. require a high voltage of 10 V or more. Therefore, as a booster circuit for generating such a high voltage, a charge-pump method that enables an easy embedding into semiconductor integrated circuits has been employed in place of a switching regulator method using coils, etc. As such a charge-pump method, Dickson charge-pump circuits are generally used, as disclosed in an example of related art: JP-A-2004-328901.

In the above charge-pump circuit, however, the substrate terminals of transistors need to be grounded for the purpose of latchup prevention. Therefore, transistors configuring a charge-pump circuit need to have a high breakdown voltage. Since such a configuration raises the internal impedance of a charge-pump circuit, there has been a problem of the degradation of conversion efficiency.

SUMMARY

An advantage of the invention is to provide a semiconductor device and a booster circuit that can improve the conversion efficiency at the time of voltage boosting, while maintaining a high breakdown voltage of transistors.

According to a first embodiment of the invention, a semiconductor device includes: a field-effect transistor that configures a charge-pump circuit; and a supporting substrate that supports the field-effect transistor so that the field-effect transistor provided on the supporting substrate becomes warpable in the channel direction.

With the above semiconductor device, a stress can be applied to the channel region of a field-effect transistor so as to warp the channel region of the field-effect transistor. Therefore, the mobility of a field-effect transistor can be improved and the transconductance of a field-effect transistor can also be increased, which makes it possible to reduce the internal impedance of a charge-pump circuit even in the case of using a high-breakdown-voltage transistor for the purpose of latchup prevention. As a result, the conversion efficiency at the time of voltage boosting can be improved and therefore various power supplies, including high-breakdown-voltage power supplies, can be embedded into semiconductor integrated circuits, while lowering the level of power supply voltage inside semiconductor integrated circuits.

Further, in the semiconductor device according to the first embodiment of the invention, it is preferable that the field-effect transistor includes: a semiconductor layer that is formed on the supporting substrate; a well that is formed on the semiconductor layer; a gate electrode that is provided on the well; a source layer that is provided on one side of the gate electrode and formed on the well; a drain layer that is provided on the other side of the gate electrode and formed on the well; and a backgate contact that is provided on the well and couples the well to the source layer.

With the above configuration, the well potential can be brought into accordance with the source potential, leading to an effective latchup prevention even in the case where N-channel field-effect transistors and P-channel field-effect transistors coexist on the same substrate.

Further, according to a second embodiment of the invention, a booster circuit includes: a first N-channel field-effect transistor, wherein a first pulse is inputted to a gate; a first P-channel field-effect transistor that is serially coupled to the first N-channel field-effect transistor, wherein the first pulse is inputted to a gate; a second N-channel field-effect transistor, wherein a gate is coupled to a drain of the first N-channel field-effect transistor; a second P-channel field-effect transistor that is serially coupled to the second N-channel field-effect transistor; a third N-channel field-effect transistor, wherein a second pulse, which has the opposite phase to the first pulse, is inputted to a gate and a source is coupled to a drain of the second N-channel field-effect transistor; a third P-channel field-effect transistor that is serially coupled to the third N-channel field-effect transistor, wherein a source is coupled to a source of the second N-channel field-effect transistor and the second pulse is inputted to a gate; a fourth N-channel field-effect transistor wherein a gate is coupled to a drain of the third N-channel field-effect transistor and a source is coupled to a source of the second N-channel field-effect transistor; a fourth P-channel field-effect transistor that is serially coupled to the fourth N-channel field-effect transistor, wherein: a gate is coupled to a drain of the third P-channel field-effect transistor, a source is coupled to the source of the third P-channel field-effect transistor, and a drain is coupled to a source of the first P-channel field-effect transistor; a first capacitor that is coupled to the drain of the second N-channel field-effect transistor, whereto the first pulse is inputted; a second capacitor that is coupled to a drain of the fourth N-channel field-effect transistor, whereto the second pulse is inputted; and a supporting substrate, on which the first to fourth N-channel field-effect transistors; the first to fourth P-channel field-effect transistors; and the first and second capacitors are provided, that supports the first to fourth N-channel field-effect transistors and the first to fourth P-channel field-effect transistors so that each of the first to fourth N-channel field-effect transistors and the first to fourth P-channel field-effect transistors becomes warpable in the channel direction.

With the above booster circuit, the channel region of a field-effect transistor that is used in a charge-pump circuit can be warped, which improves the mobility of the field-effect transistor. Therefore, the transconductance of the field-effect transistor can also be increased, which makes it possible to reduce the internal impedance of a charge-pump circuit even in the case of using a high-breakdown-voltage transistor for the purpose of latchup prevention. As a result, the conversion efficiency of a charge-pump circuit can be improved.

Further, in the booster circuit according to the second embodiment of the invention, each of the first to fourth N-channel field-effect transistors includes: a semiconductor layer that is formed on the supporting substrate; a P-well that is formed on the semiconductor layer; a first gate electrode that is provided on the P-well; an N-type source layer that is provided on one side of the first gate electrode and formed on the P-well; an N-type drain layer that is provided on the other side of the first gate electrode and formed on the P-well; and a first backgate contact that is provided on the P-well and couples the P-well to the N-type source layer. Further, each of the first to fourth P-channel field-effect transistors includes: a semiconductor layer that is formed on the supporting substrate; an N-well that is formed on the semiconductor layer; a second gate electrode that is provided on the N-well; a P-type source layer that is provided on one side of the second gate electrode and formed on the N-well; a P-type drain layer that is provided on the other side of the second gate electrode and formed on the N-well; and a second backgate contact that is provided on the N-well and couples the N-well to the P-type source layer.

With the above configuration, the well potential can be brought into accordance with the source potential, leading to an effective latchup prevention even in the case where N-channel field-effect transistors and P-channel field-effect transistors coexist on the same substrate.

Furthermore, in the booster circuit according to the second embodiment of the invention, lower electrodes of the first and second capacitors are configured of a P-type impurity diffusion layer that configures the sources/drains of the first to fourth P-channel field-effect transistors; and upper electrodes of the first and second capacitors are configured of a polycrystalline silicon layer that configures the gates of the first to fourth P-channel field-effect transistors.

With the above configuration, the first and second capacitors can be formed at a time in forming the first to fourth P-channel field-effect transistors, which makes it possible to configure a charge-pump circuit while controlling the complexity of manufacturing process.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a semiconductor device and a booster circuit according to the invention will now be described with reference to the accompanying drawings.

Figure 1:
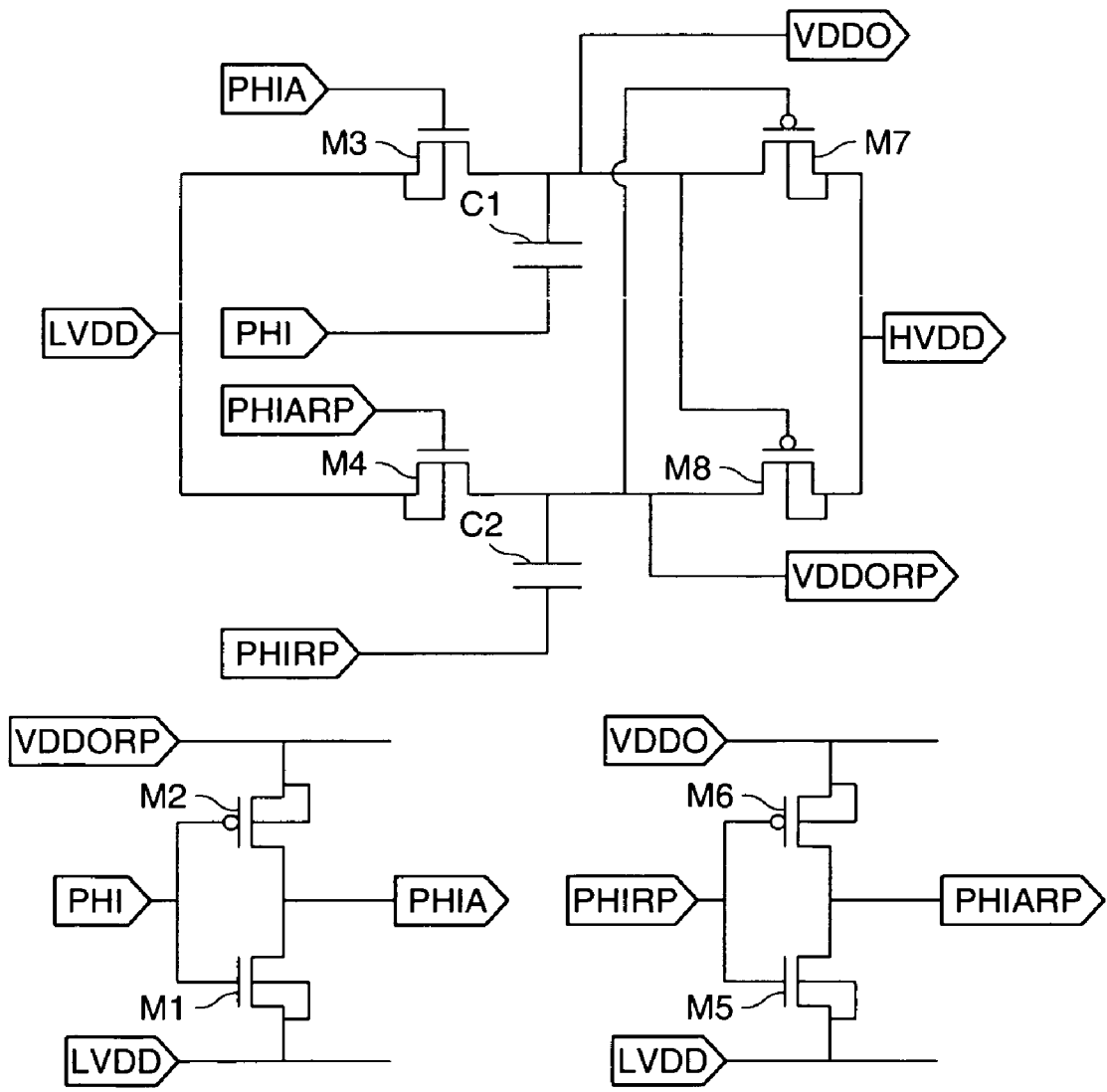
FIG. 1 is a circuit diagram showing an example configuration of a single section of a booster circuit to which a first embodiment of the invention is applied.

FIG. 1 is a circuit diagram showing an example configuration of a booster circuit to which a first embodiment of the invention is applied.

In FIG. 1, the source of an N-channel field-effect transistor M1 is coupled to an LVDD terminal; and the source of a P-channel field-effect transistor M2 is coupled to a VDDORP terminal. Further, the drain of the N-channel field-effect transistor M1 and the drain of the P-channel field-effect transistor M2 are coupled to a PHIA terminal. Furthermore, the gate of the N-channel field-effect transistor M1 and the gate of the P-channel field-effect transistor M2 are coupled to a PHI terminal. In the foregoing configuration, the substrate potential of the N-channel field-effect transistor M1 is coupled to the source of the N-channel field-effect transistor M1; and the substrate potential of the P-channel field-effect transistor M2 is coupled to the source of the P-channel field-effect transistor M2.

Also, the source of an N-channel field-effect transistor M5 is coupled to an LVDD terminal; and the source of a P-channel field-effect transistor M6 is coupled to a VDDO terminal. Further, the drain of the N-channel field-effect transistor M5 and the drain of the P-channel field-effect transistor M6 are coupled to a PHIARP terminal. Furthermore, the gate of the N-channel field-effect transistor M5 and the gate of the P-channel field-effect transistor M6 are coupled to a PHIRP terminal. In the foregoing configuration, the substrate potential of the N-channel field-effect transistor M5 is coupled to the source of the N-channel field-effect transistor M5; and the substrate potential of the P-channel field-effect transistor M6 is coupled to the source of the P-channel field-effect transistor M6.

Also, the sources of N-channel field-effect transistors M3 and M4 are coupled to an LVDD terminal; and the sources of P-channel field-effect transistors M7 and M8 are coupled to an HVDD terminal. Further, the drain of the N-channel field-effect transistor M3 and the drain of the P-channel field-effect transistor M7 are coupled to a VDDO terminal; and the drain of the N-channel field-effect transistor M4 and the drain of the P-channel field-effect transistor M8 are coupled to a VDDORP terminal. Furthermore, the gate of the N-channel field-effect transistor M3 is coupled to a PHIA terminal; the gate of the N-channel field-effect transistor M4 is coupled to a PHIARP terminal; the gate of the P-channel field-effect transistor M7 is coupled to the VDDORP terminal; and the gate of the P-channel field-effect transistor M8 is coupled to the VDDO terminal.

In the above configuration, the substrate potential of the N-channel field-effect transistor M3 is coupled to the source of the N-channel field-effect transistor M3; the substrate potential of the N-channel field-effect transistor M4 is coupled to the source of the N-channel field-effect transistor M4; the substrate potential of the P-channel field-effect transistor M7 is coupled to the source of the P-channel field-effect transistor M7; and the substrate potential of the P-channel field-effect transistor M8 is coupled to the source of the P-channel field-effect transistor M8.

Further, the PHI terminal is coupled to the drain of the N-channel field-effect transistor M3 via a capacitor C1; and the PHIRP terminal is coupled to the drain of the N-channel field-effect transistor M4 via a capacitor C2.

Figure 2:
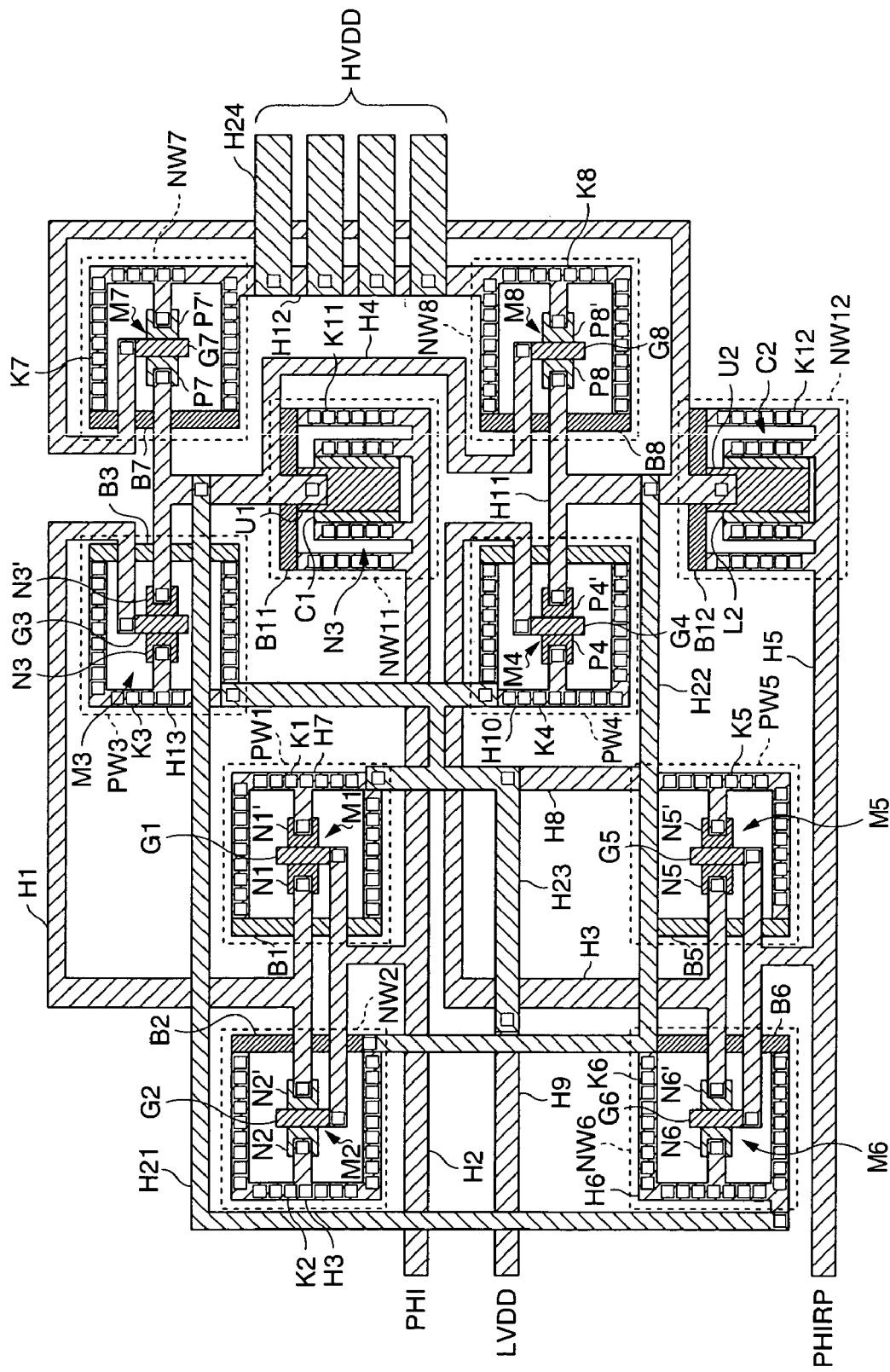
FIG. 2 is a plan view showing a layout pattern of the booster circuit in FIG. 1.

FIG. 2 is a plan view showing a layout pattern of the booster circuit in FIG. 1.

In FIG. 2, a semiconductor substrate has N-wells NW2; NW6; NW7; NW8; NW11 and NW12, and P-wells PW1; PW3; PW4 and PW5. Further, the N-channel field-effect transistors M1, M3, M4 and M5 in FIG. 1 are respectively formed on the P-wells PW1, PW3, PW4 and PW5; the P-channel field-effect transistors M2, M6, M7 and M8 in FIG. 1 are respectively formed on the N-wells NW2, NW6, NW7 and NW8; and the capacitors C1 and C2 in FIG. 1 are respectively formed on the N-wells NW11 and NW12.

That is, on the P-well PW1, a gate electrode G1 is provided, sandwiched by N-type impurity diffusion layers N1 and N1' that are formed on the P-well PW1. Further, on the P-well PW3, a gate electrode G3 is provided, sandwiched by N-type impurity diffusion layers N3 and N3' that are formed on the P-well PW3. Furthermore, on the P-well PW4, a gate electrode G4 is provided, sandwiched by N-type impurity diffusion layers N4 and N4' that are formed on the P-well PW4. Furthermore, on the P-well PW5, a gate electrode G5 is provided, sandwiched by N-type impurity diffusion layers N5 and N5' that are formed on the P-well PW5.

Also, on the N-well NW2, a gate electrode G2 is provided, sandwiched by P-type impurity diffusion layers N2 and N2' that are formed on the N-well NW2. Further, on the N-well NW6, a gate electrode G6 is provided, sandwiched by P-type impurity diffusion layers P6 and P6' that are formed on the N-well NW6. Furthermore, on the N-well NW7, a gate electrode G7 is provided, sandwiched by P-type impurity diffusion layers P7 and P7' that are formed on the N-well NW7. Furthermore, on the N-well NW8, a gate electrode G8 is provided, sandwiched by P-type impurity diffusion layers P8 and P8' that are formed on the N-well NW8.

Further, on the N-well NW11, an upper electrode U1 is provided with a P-type impurity diffusion layer L1, which is formed on the N-well NW11, opposing the upper electrode U1. Furthermore, on the N-well NW12, an upper electrode U2 is provided with a P-type impurity diffusion layer L2, which is formed on the N-well NW12, opposing the upper electrode U2.

In addition, N-type impurity diffusion layers B2, B6, B7, B8, B11 and B12 are formed on the respective periphery of the N-wells NW2, NW6, NW7, NW8, NW11 and NW12. Further, P-type impurity diffusion layers B1, B3, B4 and B5 are formed on the respective periphery of the P-wells PW1, PW3, PW4 and PW5.

Besides, the N-type impurity diffusion layer N1, the P-type impurity diffusion layer P2', and the gate electrode G3 are coupled to one another via a lower wiring layer H1. Further, the gate electrodes G1 and G2, the P-type impurity diffusion layer L1, and the PHI terminal are coupled to one another via a lower wiring layer H2; and the N-type impurity diffusion layer B11 is coupled to the lower wiring layer H2 via a backgate contact K11. Furthermore, the N-type impurity diffusion layer N5, the P-type impurity diffusion layer P6', and the gate electrode G4 are coupled to one another via a lower wiring layer H3; and the N-type impurity diffusion layer B2 is coupled to the lower wiring layer H3 via a backgate contact K2. Furthermore, the N-type impurity diffusion layer N3', the P-type impurity diffusion layer P7, the gate electrode G8, and the upper electrode U1 are coupled to one another via a lower wiring layer H4. Furthermore, the gate electrodes G5 and G6, the P-type impurity diffusion layer L2, and the PHIRP terminal are coupled to one another via a lower wiring layer H5; and the N-type impurity diffusion layer B12 is coupled to the lower wiring layer H5 via a backgate contact K12. Furthermore, the P-type impurity diffusion layer P6 is coupled to a lower wiring layer H6; and the N-type impurity diffusion layer B6 is coupled to the lower wiring layer H6 via a backgate contact K6. Furthermore, the N-type impurity diffusion layer N1' is coupled to a lower wiring layer H7; and the P-type impurity diffusion layer B1 is coupled to the lower wiring layer H7 via a backgate contact K1. Furthermore, the N-type impurity diffusion layer N5' is coupled to a lower wiring layer H8; and the P-type impurity diffusion layer B5 is coupled to the lower wiring layer H8 via a backgate contact K5. Furthermore, the LVDD terminal is coupled to a lower wiring layer H9. Furthermore, the N-type impurity diffusion layer N4 is coupled to a lower wiring layer H10; and the P-type impurity diffusion layer B4 is coupled to the lower wiring layer H10 via a backgate contact K4. Further, the N-type impurity diffusion layer N4', the P-type impurity diffusion layer P8, the gate electrode G7, and the upper electrode U2 are coupled to one another via a lower wiring layer H11. Furthermore, the P-type impurity diffusion layers P7' and P8' are coupled to each other via a lower wiring layer H12; and the N-type impurity diffusion layers B7 and B8 are respectively coupled to the lower wiring layer H12 via backgate contacts K7 and K8. Further, the N-type impurity diffusion layer N3 is coupled to a lower wiring layer H13; and the P-type impurity diffusion layer B3 is coupled to the lower wiring layer H13 via a backgate contact K3.

In addition, the lower wiring layers H4 and H6 are coupled to each other via an upper wiring layer H21. Further, the lower wiring layers H3, H6 and H11 are coupled to one another via an upper wiring layer H22. Furthermore, the lower wiring layers H7, H8, H9, H10 and H13 are coupled to one another via an upper wiring layer H23. Furthermore, the lower wiring layer H12 and the HVDD terminal are coupled to each other via an upper wiring layer H24.

In the above configuration, the N-channel field-effect transistors M1; M3; M4 and M5, and the P-channel field-effect transistors M2; M6; M7 and M8 can be mounted on a supporting substrate so that the N-channel field-effect transistors M1; M3; M4 and M5, and the P-channel field-effect transistors M2; M6; M7 and M8 can be warped in the channel direction.

By employing the above configuration, a stress can be applied to the channel region of a field-effect transistor so as to warp the channel region of the field-effect transistor. Therefore, the mobility of a field-effect transistor can be improved and further the transconductance of a field-effect transistor can also be increased, which makes it possible to reduce the internal impedance of a charge-pump circuit even in the case of using a high-breakdown-voltage transistor for the purpose of latchup prevention. As a result, the conversion efficiency at the time of voltage boosting can be improved and therefore various power supplies, including high-voltage power supplies, can be embedded into semiconductor integrated circuits, while lowering the level of power supply voltage inside semiconductor integrated circuits.

Further, by respectively coupling the N-type impurity diffusion layers B2, B6, B7 and B8 to the P-type impurity diffusion layers P2, P6, P7' and P8' via the backgate contacts K2, K6, K7 and K8, while respectively coupling the P-type impurity diffusion layers B1, B3, B4 and B5 to the N-type impurity diffusion layers N1', N3, N4 and N5' via the backgate contacts K1, K3, K4 and K5, the well potential can be brought into accordance with the source potential. Therefore, even in the case where the N-channel field-effect transistors M1; M3; M4 and M5, and the P-channel field-effect transistors M2; M6; M7 and M8 coexist on the same substrate, an effective latchup prevention can be applied.

In addition, the lower wiring layers H1 to H13 and the upper wiring layers H21 to H24 can be configured of Al wire; the gate electrodes G1 to G8 and the upper electrodes U1 and U2 can be configured of polycrystalline silicon layer; and the P-type impurity diffusion layers L1 and L2 can be used as lower electrodes of the capacitors C1 and C2.

With the above configuration, the capacitors C1 and C2 can be formed at a time in forming the P-channel field-effect transistors M2, M6, M7 and M8, which makes it possible to configure a charge-pump circuit while controlling the complexity of manufacturing process.

Figure 3:
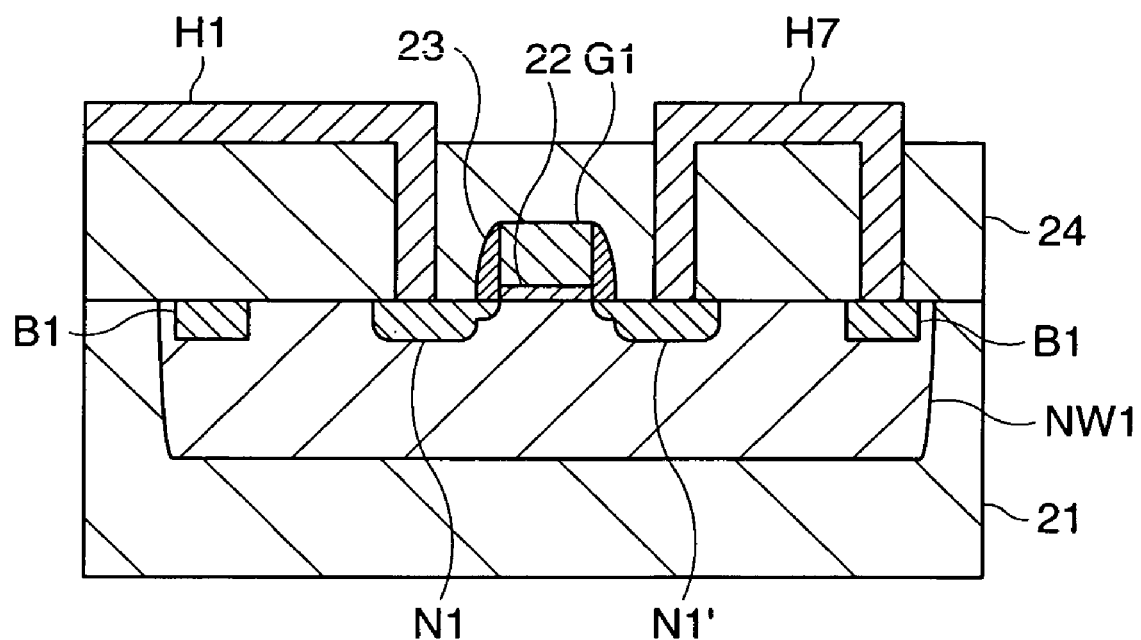
FIG. 3 is a cross section showing an example configuration of a field-effect transistor with a backgate terminal.
Figure 4A:
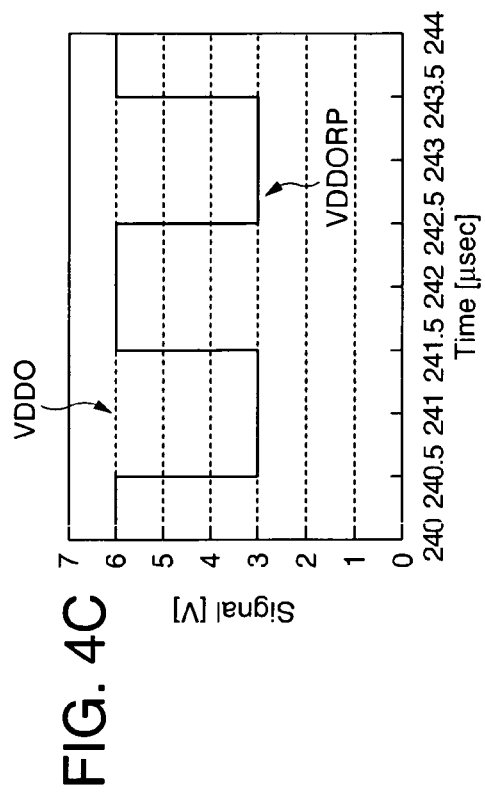
FIGS. 4A to 4D are waveform diagrams showing the output waveforms of the booster circuit in FIG. 1.
Figure 4B:
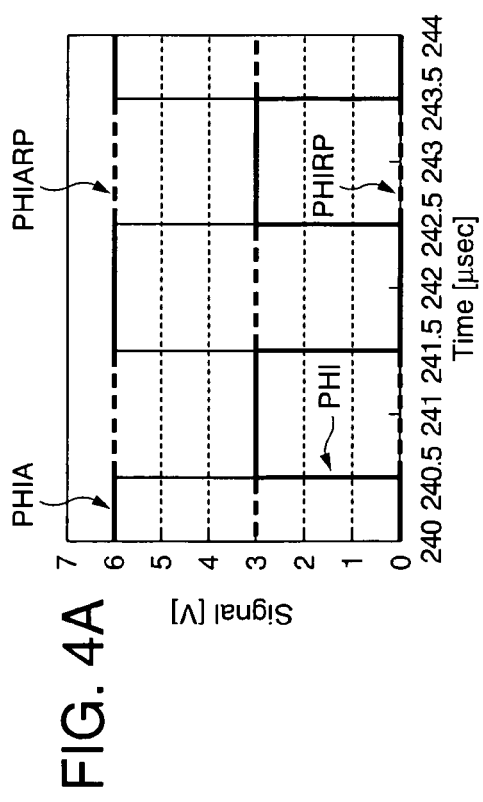
Figure 4C:
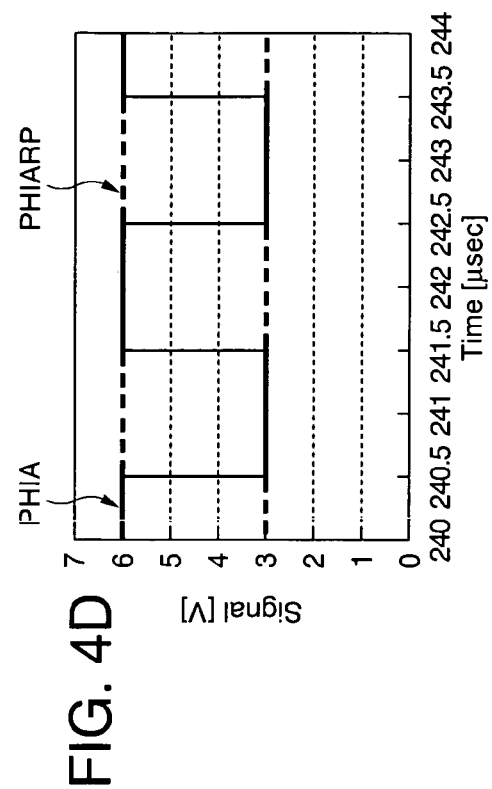
Figure 4D:
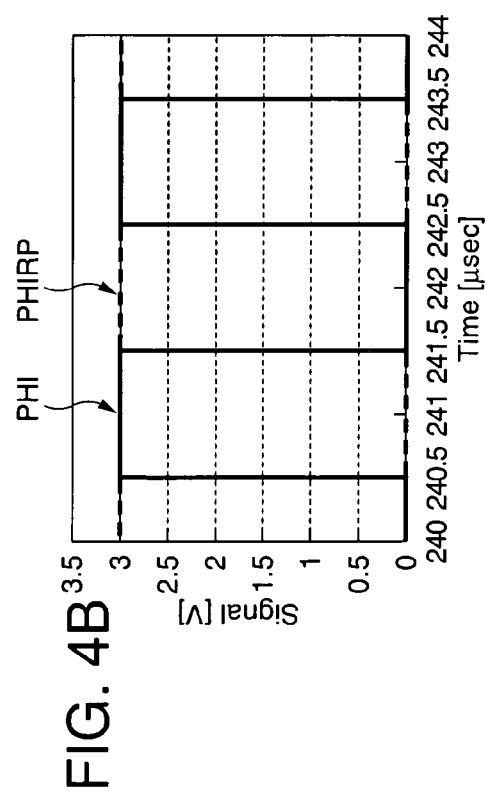

FIG. 3 is a cross section showing an example configuration of a field-effect transistor with a backgate terminal. In addition, in FIG. 3, the N-channel field-effect transistor M1 shown in FIG. 2 is taken as an example.

In FIG. 3, the N-well NW1 is formed on a semiconductor substrate 21. In addition, as the material of the semiconductor substrate 21, Si, Ge, SiGe, SiC, SiSn, PbS, GaAs, InP, GaP, GaN, ZnSe, etc. can be used, for example. Further, on the N-well NW1, the gate electrode G1 is formed via a gate insulation film 22; and side walls are formed on the sides of the gate electrode G1. Furthermore, on the N-well NW1, the N-type impurity diffusion layers Ni and Ni', which are provided on both sides of the gate electrode G1, are formed via an LDD layer. Furthermore, on the periphery of the N-well NW1, the P-type impurity diffusion layer B1 is formed. Furthermore, on the gate electrode G1, an interlayer insulation film 24 is formed. On the interlayer insulation film 24, the lower wiring layer H1, which is coupled to the N-type impurity diffusion layer N1, and the lower wiring layer H7, which couples the N-type impurity diffusion layer N1' to the P-type impurity diffusion layer B1, are formed.

FIGS. 4A to 4D are waveform diagrams showing the output waveforms of the booster circuit in FIG. 1.

In FIG. 4, a pulse signal having, for example, a duty ratio of 0.5 and an amplitude of 3 V is inputted to the PHI terminal; and another signal having the opposite phase to the signal that is inputted to the PHI terminal is inputted to the PHIRP terminal. Further, a pulse signal having, for example, a duty ratio of 0.5 and an amplitude of 3 V is inputted to the PHIA terminal; and another signal having the opposite phase to the signal that is inputted to the PHIA terminal is inputted to the PHIARP terminal. Furthermore, the LVDD terminal is rated at 3 V; and the HVDD terminal is rated at 6 V, for example. In addition, a charge of 3 V is stored in the capacitor C2; and no charge is stored in the capacitor C1.

When the PHI terminal is rated at 0 V, the N-channel field-effect transistor M1 is turned off; and the P-channel field-effect transistor M2 is turned on. Further, when the PHI terminal is rated at 0 V, the PHIRP terminal is rated at 3 V. Therefore, the potential of the capacitor C2 is raised by 3 V to make the VDDORP terminal rated at 6 V. Furthermore, when the VDDORP terminal is rated at 6 V, the PHIA terminal is rated at 6 V because the P-channel field-effect transistor M2 is on. Therefore, the N-channel field-effect transistor M3 is turned on. Furthermore, when the N-channel field-effect transistor M3 is turned on, the LVDD terminal is rated at 3 V and the PHI terminal is rated at 0 V. Therefore, the VDDO terminal is rated at 3 V and a charge of 3 V is stored in the capacitor C1 with the application of the voltage of 3 V. Furthermore, when the VDDO terminal is rated at 3 V, the P-channel field-effect transistor M8 is turned on to make the HVDD terminal rated at 6 V.

Next, when the PHI terminal is rated at 3 V, the PHIRP terminal is rated at 0 V. Therefore, the N-channel field-effect transistor M5 is turned off and the P-channel field-effect transistor M6 is turned on. Further, when the PHIRP terminal is rated at 0 V, the PHI terminal is rated at 3 V. Therefore, the potential of the capacitor C1 is raised by 3 V to make the VDDO terminal rated at 6 V. Furthermore, when the VDDO terminal is rated at 6 V, the PHIARP terminal is rated at 6 V because the P-channel field-effect transistor M6 is on, which makes the N-channel field-effect transistor M4 turned on. Furthermore, when the N-channel field-effect transistor M4 is turned on, the LVDD terminal is rated at 3 V and the PHIRP terminal is rated at 0 V. Therefore, the VDDORP terminal is rated at 3 V and a charge of 3 V is stored in the capacitor C2 with the application of the voltage of 3 V. Furthermore, when the VDDORP terminal is rated at 3 V, the P-channel field-effect transistor M7 is turned on to make the HVDD terminal rated at 6 V.

As a result, by inputting a pulse signal having an amplitude of 3 V to the booster circuit shown in FIG. 1, a voltage of 6 V can be derived. Further, by coupling N sets of the booster circuit shown in FIG. 1, the input voltage can be boosted by N times. Under the above circumstances, the conversion efficiency of a charge-pump circuit, which is approximately 60 to 70% in normal cases, can be improved up to 80% by using field-effect transistors as the N-channel field-effect transistors M1, M3, M4 and M5 and the P-channel field-effect transistors M2, M6, M7 and M8. Therefore, a logic circuit and a booster circuit that are activated at a low voltage can be integrated in one chip, which makes it possible to incorporate a logic circuit into non-volatile memories such as EEPROMs, etc. and driver ICs of indicating elements such as liquid crystal, etc., which require a high voltage of 10 V or more. Thus, the denser integration and more function multiplication of semiconductor integrated circuits can be promoted.

Figure 5:
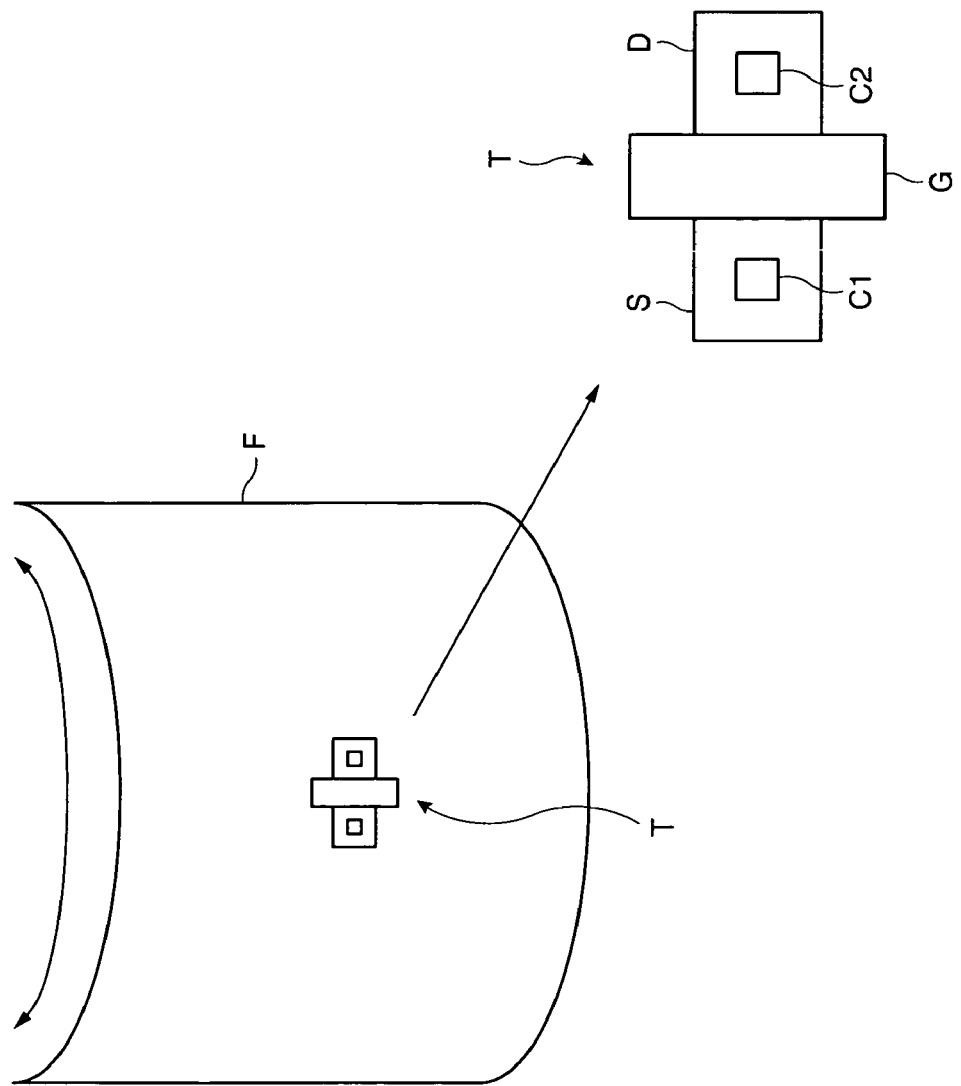
FIG. 5 is a diagram showing a method for warping a field-effect transistor according to a second embodiment of the invention.

FIG. 5 is a diagram showing a method for warping a field-effect transistor according to a second embodiment of the invention.

In FIG. 5, a field-effect transistor T has a gate electrode G, as well as a source layer S and a drain layer D, which sandwich the gate electrode G. Further, a source contact C1 and a drain contact C2 are respectively formed on the source layer S and the drain layer D. Furthermore, the field-effect transistor T is mounted on a film substrate F so that the channel direction of the field-effect transistor T accords with the warpage direction of the film substrate F.

In the above configuration, by warping the film substrate F, the channel region of the field-effect transistor T can be warped, which improves the mobility of the field-effect transistor T. Therefore, the transconductance of the field-effect transistor T can also be increased, which makes it possible to reduce the internal impedance of a charge-pump circuit even in the case of using a high-breakdown-voltage transistor as the field-effect transistor T for the purpose of latchup prevention. As a result, the conversion efficiency at the time of voltage boosting can be improved.

In addition, by using the film substrate F, on which the field-effect transistor T is mounted, as a label of a wine bottle, etc., the film substrate F can be kept warped, which enables the activation of the field-effect transistor T at a high transconductance.

What is claimed is:

1. A booster circuit, comprising:
a first N-channel field-effect transistor, wherein a first pulse is inputted to a gate;
a first P-channel field-effect transistor that is serially coupled to the first N-channel field-effect transistor, wherein the first pulse is inputted to a gate;
a second N-channel field-effect transistor, wherein a gate is coupled to a drain of the first N-channel field-effect transistor;
a second P-channel field-effect transistor that is serially coupled to the second N-channel field-effect transistor;
a third N-channel field-effect transistor, wherein a second pulse, which has an opposite phase to the first pulse, is inputted to a gate and a source is coupled to a drain of the second N-channel field-effect transistor;
a third P-channel field-effect transistor that is serially coupled to the third N-channel field-effect transistor, wherein a source is coupled to a source of the second N-channel field-effect transistor and the second pulse is inputted to a gate;
a fourth N-channel field-effect transistor wherein a gate is coupled to a drain of the third N-channel field-effect transistor and a source is coupled to a source of the second N-channel field-effect transistor;
a fourth P-channel field-effect transistor that is serially coupled to the fourth N-channel field-effect transistor, wherein: a gate is coupled to a drain of the third P-channel field-effect transistor, a source is coupled to the source of the third P-channel field-effect transistor, and a drain is coupled to a source of the first P-channel field-effect transistor;
a first capacitor that is coupled to the drain of the second N-channel field-effect transistor, whereto the first pulse is inputted;
a second capacitor that is coupled to a drain of the fourth N-channel field-effect transistor, whereto the second pulse is inputted; and
a supporting substrate, on which the first to fourth N-channel field-effect transistors; the first to fourth P-channel field-effect transistors; and the first and second capacitors are provided, that supports the first to fourth N-channel field-effect transistors and the first to fourth P-channel field-effect transistors so that each of the first to fourth N-channel field-effect transistors and the first to fourth P-channel field-effect transistors becomes warpable in a channel direction.

2. The booster circuit according to claim 1, wherein:
each of the first to fourth N-channel field-effect transistors includes:
a semiconductor layer that is formed on the supporting substrate;
a P-well that is formed on the semiconductor layer;
a first gate electrode that is provided on the P-well;
an N-type source layer that is provided on one side of the first gate electrode and formed on the P-well;
an N-type drain layer that is provided on an other side of the first gate electrode and formed on the P-well; and
a first backgate contact that is provided on the P-well and couples the P-well to the N-type source layer, and
each of the first to fourth P-channel field-effect transistors includes:
a semiconductor layer that is formed on the supporting substrate;
an N-well that is formed on the semiconductor layer;
a second gate electrode that is provided on the N-well;
a P-type source layer that is provided on one side of the second gate electrode and formed on the N-well;
a P-type drain layer that is provided on an other side of the second gate electrode and formed on the N-well; and
a second backgate contact that is provided on the N-well and couples the N-well to the P-type source layer.

3. The booster circuit according to claim 1, wherein:
lower electrodes of the first and second capacitors are configured of a P-type impurity diffusion layer that configures the sources/drains of the first to fourth P-channel field-effect transistors; and
upper electrodes of the first and second capacitors are configured of a polycrystalline silicon layer that configures the gates of the first to fourth P-channel field-effect transistors.

* * * * *

UNITED STATES PATENT AND TRADEMARK OFFICE
CERTIFICATE OF CORRECTION

PATENT NO.       : 7,612,412 B2  
APPLICATION NO.  : 11/387227  
DATED            : November 3, 2009  
INVENTOR(S)      : Yoshiharu Ajiki Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 810 days.

Signed and Sealed this

Nineteenth Day of October, 2010

David J. Kappos  
*Director of the United States Patent and Trademark Office*